United States Patent [19]

Karnezos et al.

[11] Patent Number: 5,065,280
[45] Date of Patent: Nov. 12, 1991

[54] FLEX INTERCONNECT MODULE

[75] Inventors: Marcos Karnezos, Menlo Park; Ravindhar Kaw, San Jose; Lawrence Hanlon, Menlo Park; Farid Matta, Mountain View, all of Calif.

[73] Assignee: Hewlett-Packard Company, Palo Alto, Calif.

[21] Appl. No.: 575,098

[22] Filed: Aug. 30, 1990

[51] Int. Cl.$^5$ .............................................. H05K 7/20
[52] U.S. Cl. ................................... 361/386; 361/387; 361/388; 361/389; 357/79; 357/81; 165/185; 174/16.3
[58] Field of Search ............... 361/386, 387, 388, 389, 361/398, 414; 357/79, 81; 174/16.3, 252; 165/80.3, 185

[56] References Cited

U.S. PATENT DOCUMENTS 4,517,624  5/1985  Wessely ............................. 361/387
4,755,911  9/1988  Suzuki ................................ 361/414
4,914,551  4/1990  Anschel et al. .................... 361/389
4,954,878  9/1990  Fox et al. ............................ 357/81

Primary Examiner—Harold Broome
Assistant Examiner—Young S. Whang

[57] ABSTRACT

An electronic packaging module in which the inactive sides of integrated circuit chips are held in compression against a heat spreader by an elastomer pressed thereagainst by a multilayer flexible printed circuit board. A TAB frame, which may be demountable, interconnects integrated circuit chips to a multilayer flexible printed circuit board. A backing plate is fastened to a heat spreader so that it presses against the multilayer flexible printed circuit board. Contacts are compressed against the motherboard to interconnect the multilayer flexible printed circuit board thereto. Coaxial power connectors provide power and ground connections between non-peripheral portions of the multilayer flexible printed circuit board and the motherboard.

7 Claims, 3 Drawing Sheets

FLEX INTERCONNECT MODULE

BACKGROUND OF THE INVENTION

1. Field of the Invention

This invention relates to electronic component and circuit packaging techniques and, in particular, to packaging techniques useful for the fabrication of dense, high speed digital circuits and subassemblies such as those used in the construction of computers.

2. Description of the Prior Art

The performance of today's computers depend primarily on the performance of the main chip-set subassembly and the cache memory access time of each computer. This performance is limited by the delay of the computer package, including the signal paths interconnecting the integrated circuit chips in the subassembly. These paths include the individual chip packages, the interconnect substrate, the motherboard and the various connectors and cables.

As the operating frequencies of computers approach 100 MHz, packaging delays are increasingly becoming the limiting factor in the operation and performance of today's computers. For these reasons, high performance main frame computers have used various techniques for packaging and assembling the critical chips of a computer in a compact, high frequency unit which is assembled to the next level subassembly, the backplane, with minimal performance loss.

Many packaging techniques have been used for the fabrication of such electronic circuits and subassemblies. The primary requirements for such packaging techniques include high circuit density, convenient construction, testing and repair techniques as well as high speed circuit performance and efficient thermal transfer and dissipation. Many conventional packaging techniques satisfy one or more of these requirements for particular applications.

A currently popular manufacturing technique, known as TAB or Tape Automated Bonding, has proven to be particularly useful for high volume manufacturing of circuit subassemblies. TAB techniques utilize a frame of conductors in a pattern, the inner contacts of each conductor being connected to appropriate contact points on a semiconductor chip. The outer contacts are utilized first for testing purposes and then for permanent bonding connections to the next high level of circuit subassembly, such as a printed circuit board substrate.

A particularly convenient variation of this technique is known as DTAB which stands for Demountable Tape-Automated Bonding and is disclosed in U.S. patent application Ser. No. 07/401,053, filed 08/31/89 and assigned to a common assignee. DTAB utilizes a demountable pressure contact between the outer frame ends and the printed circuit board for electrical connection. An elastomer may be used between the frame contacts and a pressure cap for controlled, demountable electrical connection therebetween.

Heat transfer techniques have become important as circuit densities and speed result in the close proximity of heat generating and heat degradable components. Heat sinks are commonly used to transfer heat from individual components, or groups of substantially identical components, to air or other cooling mediums.

The most commonly used heat transfer techniques position the circuit components active side facing the printed circuit board, and mount a heat sink on the back side. An alternative approach provides a thermal dissipation path through the printed circuit board or other substrate. Such techniques are cumbersome, expensive and substantially interfere with the repairability of individual components.

SUMMARY OF THE INVENTION

The preceding and other shortcomings of the prior art are addressed and overcome by the present invention that provides an electronic module, including heat spreader means, a plurality of integrated circuit chips, a chip interconnect frame in electrical contact with each chip, a multilayer flexible conductor module in electrical contact with each chip interconnect frame, a motherboard assembly in electrical contact with the flexible conductor module, and mounting means for maintaining the chips in compression between the flexible conductor module and the heat spreader conductor.

In a further aspect, the present invention provides a method of packaging an electronic module by mounting a plurality of integrated circuit chips in contact with a heat spreader, interconnecting the active side of each chip to a multilayer flexible conductor module, interconnecting a motherboard assembly with the flexible conductor module, and maintaining the chips in compression between the flexible conductor module and the heat spreader.

These and other features and advantages of this invention will become further apparent from the detailed description that follows which is accompanied by one or more drawing figures. In the figures and description, numerals indicate the various features of the invention, like numerals referring to like features throughout both the drawings and the description.

DETAILED DESCRIPTION OF THE PREFERRED EMBODIMENT(S)

Figure 1:
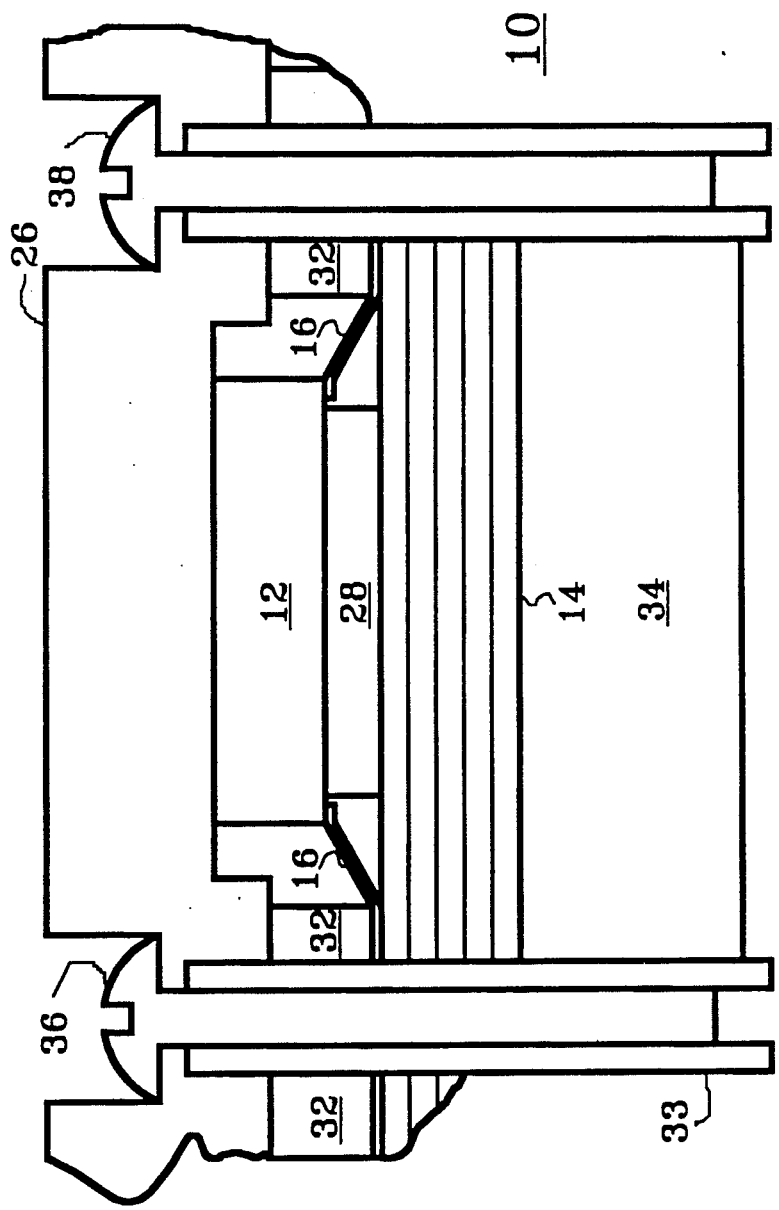
FIG. 1 is a cross-sectional view of circuit subassembly portion 10 showing the mounting of integrated circuit chip 12 to multilayer flexible printed circuit board 14 including the electrical interconnection therebetween by TAB frame 16.

In accordance with the present invention, FIG. 1 is a cross-sectional view of circuit subassembly portion 10 showing the mounting of integrated circuit chip 12 to a flexible conductor module, such as multilayer flexible printed circuit board 14. Multilayer flexible printed circuit board 14 may conveniently be a conventional flexible printed circuit board having multiple internal conducting metal layers.

Integrated circuit chip 12 is oriented so that the active surface, including the active components and electrical connections, is face down - that is - facing towards multilayer flexible printed circuit board 14. The opposite surface of integrated circuit chip 12 is oriented upwards toward heat spreader 26. The contact between integrated circuit chip 12 and heat spreader 26 may be treated for more efficient heat transfer by, for example, providing a layer of silicone grease, such as THERMALCOAT available from Thermalloy Inc., of Dallas, Tex. or a silicone adhesive such as silicone adhesive 102-32, available from Creative Materials Inc., of Tyngsboro, Mass.

Integrated circuit chip 12 is pressed against heat spreader 26 by elastomer 28 sandwiched against integrated circuit chip 12 by pressure from multilayer flexible printed circuit board 14. Integrated circuit chip 12 is electrically connected to multilayer flexible printed circuit board 14 by TAB frame 16. TAB frame 16 may be a conventional TAB frame in which case the inner leads thereof are bonded to integrated circuit chip 12 using conventional techniques such as single point thermosonic or thermocompression gang bonding, while the outer leads are solder bonded to multilayer flexible printed circuit board 14.

In a preferred embodiment of the invention as shown in FIG. 1, the DTAB technique referenced above may be used so that the outer leads of TAB frame 16 are demountably connected by pressure to the appropriate contacts on multilayer flexible printed circuit board 14. The compression needed to maintain this pressure contact is provided by elastomer 32 sandwiched between heat spreader 26 and multilayer flexible printed circuit board 14.

Multilayer printed circuit board 14 is itself pressed against elastomer 32, TAB frame 16 and elastomer 28 by backing plate 34 which is pulled against heat spreader 26 by a series of fasteners, such as fasteners 36 and 38, each associated with an alignment pin 33 that serves to align all portions of circuit subassembly portion 10.

During operation of circuit subassembly portion 10, heat generated by integrated circuit chip 12 is carried away by contact with heat spreader 26. Integrated circuit chip 12 is interconnected to multilayer flexible printed circuit board 14 and any associated circuitry by TAB frame 16.

During assembly of circuit subassembly portion 10, integrated circuit chip 12 is first bonded to TAB frame 16. Integrated circuit chip 12 may then be tested by contact with the outer leads of TAB frame 16 before being assembled into any larger subassembly. Repair at this stage would normally consist of repair of the connections between TAB frame 16 and integrated circuit chip 12 and/or replacement of TAB frame 16 if feasible.

Integrated circuit chip 12 would then be positioned between heat spreader 26 and multilayer flexible printed circuit board 14 and held in place by fasteners 36 and 38 pressing backing plate 34 towards multilayer flexible printed circuit board 14 compressing elastomer 28 and elastomer 32. Electrical connection between TAB frame 16 and multilayer flexible printed circuit board 14 is accomplished by this pressure. Repair or replacement of integrated circuit chip 12 after further testing, or actual use, may easily be accomplished by demounting fasteners 36 and 38.

Circuit subassembly portion 10 may be part of a larger assembly, including additional integrated circuits and other components interconnected via multilayer flexible printed circuit board 14. A larger subassembly including multiple circuit subassembly portions 10, 37 and 39 is shown in FIG. 2 as circuit assembly 18.

Figure 2:
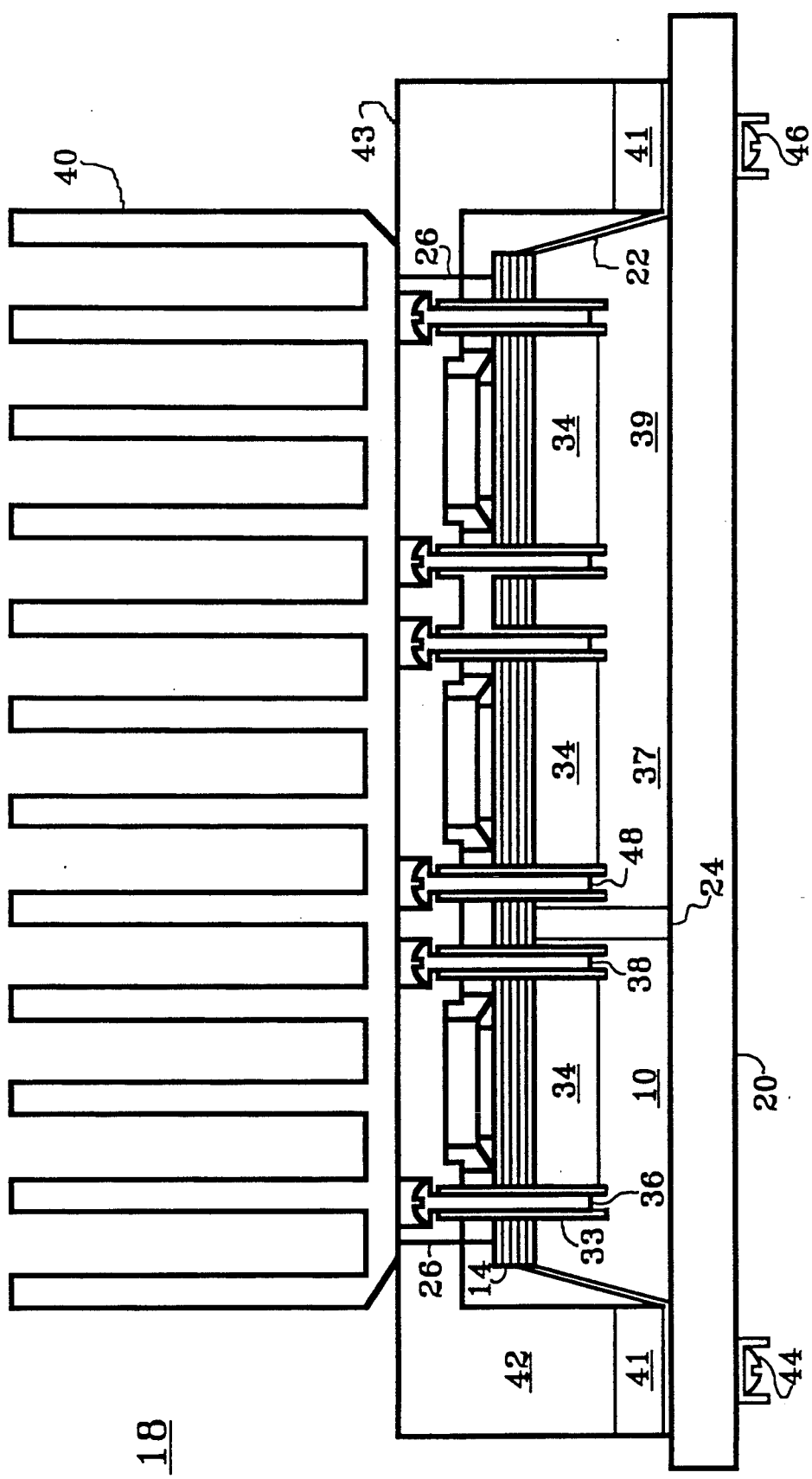
FIG. 2 is a cross-sectional view of circuit assembly 18, including a plurality of integrated circuit chips 12, each mounted to multilayer flexible printed circuit board 14, which is itself connected directly to motherboard 20 by heat spreader connectors 42 and 43, fasteners 44 and 46.

Referring now to FIG. 2, multilayer flexible printed circuit board 14 provides common interconnection between integrated circuit chip 12 in circuit subassembly portion 10 and other integrated circuits in circuit subassembly portions 37 and 39. Common backing plate 34 is fastened to heat spreader 26 in the area surrounding circuit subassembly portion 10 by fasteners 36 and 38, each of which is associated with a related alignment pin 33.

The pressure of backing plate 34 against multilayer flexible printed circuit board 14 assures that this flexible circuit board maintains relatively evenly distributed pressure against the appropriate elastomers, such as elastomers 28 and 32 as shown in FIG. 1, and provides a wider range of component thickness tolerance. The demountable electrical connection between the integrated circuits and multilayer flexible printed circuit board 14, as well as the connections between and motherboard 20, is discussed in more detail below.

In addition, the pressure from backing plate 34 provides the contact needed for good thermal conduction between the integrated circuits and heat spreader 26. Air cooling fin 40 may be added to heat spreader 26 to provide additional cooling for critical components.

Multilayer printed circuit board 14 may itself be connected to a larger printed circuit board or other assembly, such as motherboard 20, by an integral extension of one or more of the metal layers of multilayer flexible printed circuit board 14, such as extension contacts 22. Contacts 22 are compressed against motherboard 20 by elastomer 41. Elastomer 41 is held against motherboard 20 by heat spreader connectors 42 and 43 fastened at one end to heat spreader 26 by conventional means not shown and at the other end to motherboard 20 by screws or other fasteners, such as fasteners 44 and 46.

During assembly, after appropriate testing and assembly of circuit subassembly portions 10, 37 and 39 to common heat spreader 26, heat spreader 26 is fastened to motherboard 20 by heat spreader connectors 42 and 43. This permits the testing of the entire subassembly and rework or replacement of components, as necessary.

It is important to note that the assembly configuration just described permits direct cooling for the integrated circuits and other components by contact of their inactive sides with common heat spreader 26, and therefore air cooling fin 40, even though such components may have different thicknesses. Mounting stresses related to assembly and/or rework of subassemblies are not transferred to motherboard 20. The circuit board area of motherboard 20 directly beneath circuit assembly 18 is substantially unused for subassembly interconnections, providing opportunity for using this area for other interconnections, thereby increasing potential circuit density.

In accordance with a preferred embodiment of the present invention, power and ground connections between motherboard 20 and multilayer flexible printed circuit board 14 may be accomplished without use of circuit traces within extension contacts 22. In particular, it may be convenient to bring power and ground connections directly from motherboard 20 to the appropriate locations on multilayer flexible printed circuit board 14 by coaxial power connectors, such as coaxial power connector 24.

These coaxial power connectors may be positioned in any appropriate location, including in openings not shown in backing plate 34. It is, however, most convenient to position such coaxial power connectors in locations in which there is direct access between motherboard 20 and multilayer flexible printed circuit board 14. One such location is shown in FIG. 2 for coaxial power connector 24 which has been positioned between fastener 38 of circuit subassembly portion 10 and fastener 48 of subassembly portion 37.

Figure 3:
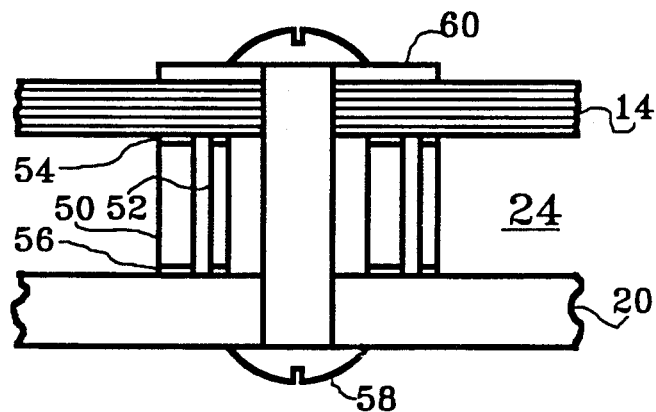
FIG. 3 is an enlarged cross-sectional view of coaxial power connector 24 which provides power and ground connections between multilayer flexible printed circuit board 14 and motherboard 20.

The design and operation of coaxial power connector 24 may be understood in greater detail from the enlarged cross sectional view thereof shown in FIG. 3.

Referring now to FIG. 3, coaxial power connector 24 is shown in cross sectional view providing power and ground connections between multilayer flexible printed circuit board 14 and motherboard 20. Coaxial power connector 24 includes outer conducting cylinder 50 which may conveniently be used as a ground interconnection, and inner conducting cylinder 52 which may conveniently be used for power connections. Multiply internal conducting cylinders may be used in circuit assemblies which require multiple power buss connections.

Each conducting cylinder makes contact with appropriate conducting pads on multilayer flexible printed circuit board 14 and motherboard 20, such as ground contact 54 on multilayer flexible printed circuit board 14 and ground contact 56 on motherboard 20. Coaxial power connector 24 is held together by multilayer flexible printed circuit board 14, motherboard 20, fastener 58 and/or appropriate insulating washers such as insulating washer 60.

Figure 4:
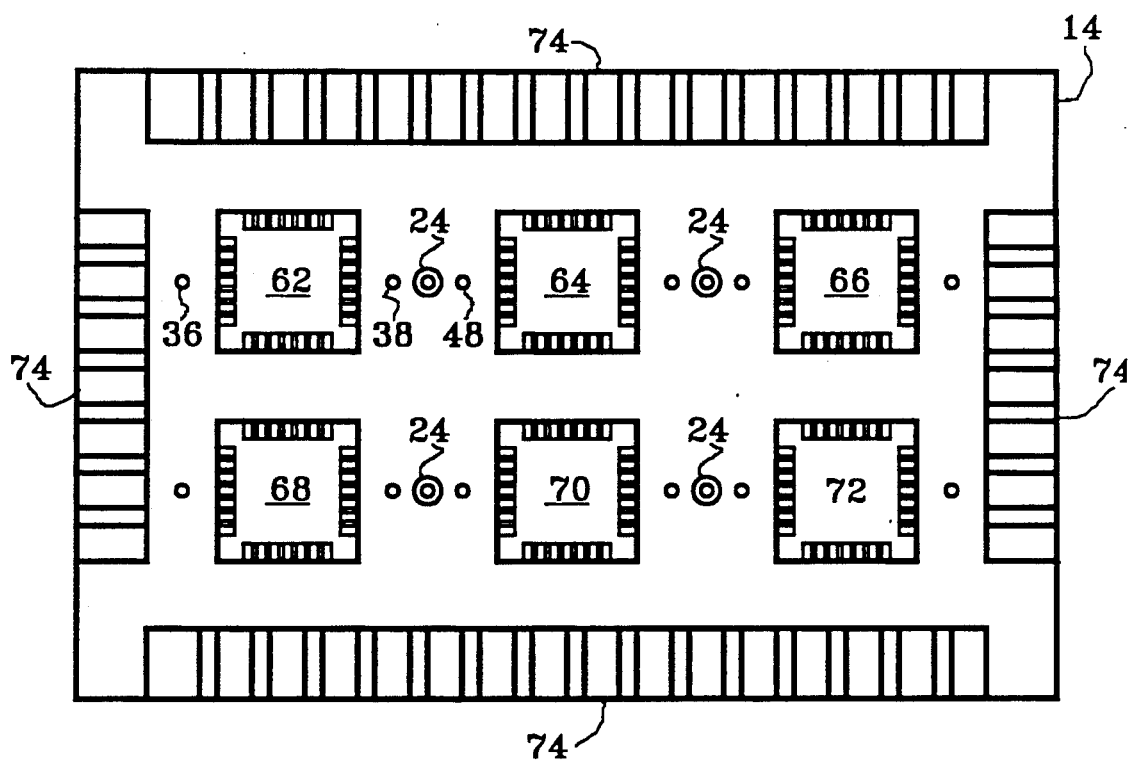
FIG. 4 is a top view of multilayer flexible printed circuit board 14 as shown in FIGS. 1, 2 and 3, above.

Referring now to FIG. 4, a top view of a particular example of multilayer flexible printed circuit board 14 is shown including TAB frame mounting pad areas 62, 64, 66, 68, 70 and 72. This layout may conveniently be used for a memory subassembly. TAB frame mounting pad area 62 may be the pads on the upper surface of multilayer flexible printed circuit board 14 used for interconnection with TAB frame 16, as shown in FIG. 1, to provide signal paths to integrated circuit chip 12. Surrounding TAB frame mounting pad area 62 are fasteners 36 and 38 and coaxial power connector 24 positioned as shown in FIG. 2 between fastener 38 and fastener 48.

Around the periphery of multilayer flexible printed circuit board 14 are shown TAB frame mounting pad areas 74 provided for interconnection between multilayer flexible printed circuit board 14 and motherboard 20 by compression of contacts 22 by elastomer 41, as shown in FIG. 2.

The present invention is extremely useful in the fabrication of electronic subassemblies requiring rework and repair at all levels of assembly while requiring high speed operation and efficient thermal transfer of unwanted heat generated in the circuitry. It is particularly suited to memory boards as shown in FIG. 4 or for the main computer chip-set for high performance computers, such as today's workstations.

While this invention has been described with reference to its presently preferred embodiment(s), its scope is not limited thereto. Rather, such scope is only limited insofar as defined by the following set of claims and all equivalents thereof.

What is claimed is:

1. An electronic module, comprising:
   heat spreader means;
   a plurality of integrated circuit chips;
   a chip interconnect frame in electrical contact with each chip;
   a multilayer flexible conductor module in electrical contact with each chip interconnect frame;
   a motherboard assembly in electrical contact with the flexible conductor module;
   elastomer means compressed between the flexible conductor module and the chips; and
   mounting means including an inflexible backing plate urging the flexible conductor toward the chips for maintaining the chips in compression between the flexible conductor module and the heat spreader conductor.

2. The electronic module claimed in claim 1, wherein the mounting means further comprises:
   means for aligning and compressing the chips, elastomer means and the flexible conducting module between the heat spreader and the backing plate.

3. The electronic module claimed in claim 1, wherein the mounting means further comprises:
   means for compressing extension contacts around the periphery of the flexible conductor module to the motherboard.

4. The electronic module claimed in claim 3, wherein the mounting means further comprises:
   coaxial power connector means for directly interconnecting non-peripheral portions of the flexible conductor module to the motherboard.

5. A method of packaging an electronic module, comprising the steps of:
   mounting a plurality of integrated circuit chips in contact with a heat spreader;
   interconnecting the active side of each chip to a multilayer flexible conductor module;
   interconnecting a motherboard assembly with the flexible conductor module;
   urging an inflexible backing plate against the flexible conductor toward the chips; and
   compressing an elastomer between the flexible conductor module and the chips to maintain the chips in compression between the flexible conductor module and the heat spreader.

6. The method of packaging an electronic module claimed in claim 5, further comprising the step of:
   compressing extension contacts around the periphery of the flexible conductor module against the motherboard.

7. The method of packaging an electronic module claimed in claim 6, further comprising the step of:
   directly interconnecting non-peripheral portions of the flexible conductor module to the motherboard with coaxial power connectors.

* * * * *